United States Patent
Belopolsky (10) Patent No.: US 7,249,411 B2
(45) Date of Patent: Jul. 31, 2007

(54) METHODS FOR MOUNTING SURFACE-MOUNTED ELECTRICAL COMPONENTS

(75) Inventor: Yakov Belopolsky, Harrisburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 337 days.

(21) Appl. No.: 10/885,400

(22) Filed: Jul. 6, 2004

(65) Prior Publication Data

US 2004/0237298 A1    Dec. 2, 2004

Related U.S. Application Data

(62) Division of application No. 10/255,312, filed on Sep. 26, 2002, now Pat. No. 6,791,845.

(51) Int. Cl.
*H05K 3/30* (2006.01)

(52) U.S. Cl. .................... 29/832; 29/852; 29/884; 29/840; 29/843; 228/180.21; 228/180.22

(58) Field of Classification Search .......... 29/593–595, 29/830, 840–843, 852, 874, 876, 878, 884; 361/720, 760; 174/52.4; 257/777–779, 257/737–738; 439/79, 83, 70, 91, 876; 228/180.21–180.22, 185

See application file for complete search history.

(56) References Cited

U.S. PATENT DOCUMENTS

| | | | |
|---|---|---|---|
| 4,217,024 A | 8/1980 | Aldridge et al. | 339/275 |
| 4,518,112 A | 5/1985 | Miller et al. | 228/124.1 |
| 4,536,955 A | 8/1985 | Gudgeon | 29/840 |
| 4,647,476 A * | 3/1987 | Anthony | 438/665 |
| 4,661,654 A * | 4/1987 | Strobel | 174/263 |
| 4,767,344 A | 8/1988 | Noschese | 439/83 |
| 4,878,611 A | 11/1989 | LoVasco et al. | 228/180.2 |
| 5,086,966 A | 2/1992 | Melton et al. | 228/208 |
| 5,102,829 A * | 4/1992 | Cohn | 29/837 |
| 5,214,308 A | 5/1993 | Nishiguchi et al. | 257/692 |
| 5,261,593 A | 11/1993 | Casson et al. | 228/180.22 |
| 5,473,813 A * | 12/1995 | Chobot et al. | 29/837 |
| 5,490,040 A | 2/1996 | Gaudenzi et al. | 361/773 |
| 5,637,008 A | 6/1997 | Kozel | 439/342 |
| 5,691,041 A | 11/1997 | Frankeny et al. | 428/209 |

(Continued)

FOREIGN PATENT DOCUMENTS

JP    2 28990    1/1990

(Continued)

OTHER PUBLICATIONS

Ray, S. et al., "Clasp Ceramic Column Grid Array Technology for Flip Chip Carriers", *Advanced Packaging Technologies Tutorial-Semicon*, 1999, A1-A7.

*Primary Examiner*—Minh Trinh
(74) *Attorney, Agent, or Firm*—Woodcock Washburn LLP (57) ABSTRACT

Methods for mounting electrical components on a substrate and securely retaining the components are described. The methods include altering solder paste compositions, interposed between component retentive pins and retentive through holes, during a reflow process. Electronic assemblies including circuit boards and electrical components mounted thereto are also described. In one of the electronic assembly embodiments, materials originally associated with a mounted electrical component migrate into solder paste coupling the electrical component to the circuit board.

7 Claims, 6 Drawing Sheets

U.S. PATENT DOCUMENTS

| | | | |
|---|---|---|---|
| 5,729,896 A | 3/1998 | Dalal et al. | 29/840 |
| 5,735,452 A | 4/1998 | Yu et al. | 228/254 |
| 5,742,484 A | 4/1998 | Gillette et al. | 361/789 |
| 5,743,009 A | 4/1998 | Matsui et al. | 29/843 |
| 5,751,556 A | 5/1998 | Butler et al. | 361/773 |
| 5,755,595 A | 5/1998 | Davis et al. | 439/607 |
| 5,772,451 A | 6/1998 | Dozier, II et al. | 439/70 |
| 5,796,590 A * | 8/1998 | Klein | 361/774 |
| 5,799,393 A * | 9/1998 | Backasch et al. | 29/852 |
| 5,810,607 A | 9/1998 | Shih et al. | 439/66 |
| 5,831,825 A | 11/1998 | Fromont | 361/719 |
| 5,874,776 A | 2/1999 | Kresge et al. | 257/747 |
| 5,876,219 A | 3/1999 | Taylor et al. | 439/74 |
| 5,883,782 A | 3/1999 | Thurston et al. | 364/704 |
| 5,888,884 A | 3/1999 | Wojnarowski | 438/462 |
| 5,893,725 A | 4/1999 | Bhansali | 438/108 |
| 5,919,050 A | 7/1999 | Kehley et al. | 439/71 |
| 5,938,451 A | 8/1999 | Rathburn | 439/66 |
| 5,955,888 A | 9/1999 | Frederickson et al. | 324/761 |
| 5,969,945 A | 10/1999 | Cutting et al. | 361/704 |
| 5,978,229 A | 11/1999 | Kim | 361/760 |
| 5,984,726 A | 11/1999 | Wu | 439/607 |
| 6,012,948 A | 1/2000 | Wu | 439/567 |
| 6,031,710 A | 2/2000 | Wolf et al. | 361/302 |
| 6,037,044 A | 3/2000 | Giri et al. | 428/209 |
| 6,089,878 A | 7/2000 | Meng | 439/79 |
| 6,116,926 A | 9/2000 | Ortega et al. | 439/108 |
| 6,152,756 A | 11/2000 | Huang et al. | 439/342 |
| 6,174,198 B1 | 1/2001 | Wu et al. | 439/541.5 |
| 6,183,301 B1 | 2/2001 | Paagman | 439/608 |
| 6,196,871 B1 | 3/2001 | Szu | 439/571 |
| 6,203,690 B1 | 3/2001 | Findeis et al. | 205/683 |
| 6,220,895 B1 | 4/2001 | Lin | 439/607 |
| 6,325,644 B1 | 12/2001 | Lemke et al. | 439/83 |
| 6,527,587 B1 | 3/2003 | Ortega et al. | 439/608 |
| 6,529,385 B1 | 3/2003 | Brady et al. | 361/766 |
| 6,544,046 B1 | 4/2003 | Hahn et al. | 439/83 |
| 6,545,890 B2 | 4/2003 | Pitzele | 363/147 |
| 6,791,845 B2 * | 9/2004 | Belopolsky | 361/760 |

FOREIGN PATENT DOCUMENTS

| | | |
|---|---|---|
| JP | 08 125 379 | 5/1996 |
| WO | WO 97/43885 | 11/1997 |
| WO | WO 97/44859 | 11/1997 |
| WO | WO 98/15989 | 4/1998 |
| WO | WO 98/15991 | 4/1998 |

* cited by examiner

METHODS FOR MOUNTING SURFACE-MOUNTED ELECTRICAL COMPONENTS

CROSS-REFERENCE TO RELATED APPLICATIONS

This application is a division of U.S. patent application Ser. No. 10/255,312, filed Sep. 26, 2002, now U.S. Pat. No. 6,791,845, the contents of which are hereby incorporated herein by reference. This application is related to U.S. patent application Ser. No. 10/729,710, filed Dec. 5, 2003.

FIELD OF THE INVENTION

The present invention relates to surface mounted electrical components having improved retentive properties, and methods for mounting and retaining electrical components on substrates.

BACKGROUND OF THE INVENTION

Various methods of electrically connecting components such as connectors and integrated circuit devices to printed boards are well known in the art. Surface mount technology is increasingly being employed as cost-effective method. Examples of surface mount technology include pin grid arrays (PGA's), ball grid arrays (BGA's), column grid arrays (CGA's), and land grid array (LGA's). Generally with such methods, a solder paste is introduced between surfaces to be joined, the solder paste reflowed, and then cooled to form a mechanical and electrically conductive joint.

As the name implies, ball grid arrays (BGA's) utilize a grid or array of solder bumps or balls arranged on one side of an electrical component to effectuate electrical and mechanical connection with a printed board. The ball attachment sites are typically referred to as lands or pads. Solder past is disposed on the lands (and/or on the balls), such as through screening or masking techniques, and the electrical component is then positioned on the board so that the balls and lands are registered. The board is then processed at an elevated temperature sufficient to cause the solder and at least a portion or all of the solder ball to flow and fuse with the underlying land/pad to form the electrical interconnection. See, for example, U.S. Pat. No. 6,325,644 assigned to the assignee of this patent, and patents within that patent, all of which is incorporated by reference herein.

Locator pins extending from the electrical component may be employed to facilitate the initial alignment of the electrical component. The locator pins are inserted into through holes located in the board at locations along the periphery of the array of lands/pads. Pin diameters may be slightly larger than the corresponding through hole diameters so that an interference fit is achieved. Alternatively, the pin diameters may be smaller than the through hole diameters. In this scenario, adhesive or solder paste may be applied in and around the through holes to help retain the electrical component on the substrate.

By selecting locator pins with a relatively smaller diameter and applying solder within the through holes, the BGA balls are allowed to float (that is, not rigidly restricted) during a reflow process resulting in self-alignment and ultimately a low stress solder joint. Component retention however may be compromised with this configuration when the board is manipulated before the reflow heat is substantially dissipated, or when the board is rotated so that additional electrical components can be mounted on other available surface areas with subsequent reflow steps.

Accordingly, there is a need for a method of mounting electrical components on a substrate that provides for a low stress solder joint while effectively retaining the mounted components during ensuing double-sided handling and/or processing during a second reflow step.

SUMMARY OF THE INVENTION

Methods for mounting electrical components on substrates are provided by the present invention. In accordance with a first preferred embodiment of the present invention, there has now been provided a method for mounting and retaining an electrical component on a substrate that is subjected to at least two thermal cycles. The method comprises the steps of: disposing solder paste of a first solder composition into a retentive through hole of the substrate; inserting a retentive pin extending from the electrical component and having a relatively smaller diameter into the retentive through hole; subjecting the substrate to a first thermal cycle such that material associated with at least one of the retentive through hole and retentive pin migrates into the solder paste to create a mixed solder composition that has a higher melting point than the first solder composition; and then subjecting the substrate to a second thermal cycle having a peak temperature less than the melting point of said mixed solder composition.

In accordance with another preferred embodiment of the present invention, there has now been provided a method for making an electronic assembly. The method comprises the steps of: providing a circuit board including a retentive through hole having a wall; providing an electrical connector having a retentive pin extending therefrom, wherein the retentive pin has a diameter smaller than the retentive through hole and is made from a material comprising a precious metal; disposing solder paste of a first solder composition into the retentive through hole; inserting the retentive pin into the retentive through hole; and reflowing the solder paste such that at least some of the precious metal originally associated with the retentive pin migrates into the solder paste to create a mixed solder composition.

In accordance with yet another preferred embodiment of the present invention, there has now been provided a method for mounting electrical components on opposing sides of a substrate. The method comprises the steps of: providing a substrate including first and second sides and first and second retentive through holes; providing a first electrical component including a first retentive pin extending therefrom, wherein the first retentive pin has a diameter smaller than that of the first retentive through hole, and has plating material thereon; disposing solder paste of a first solder composition into said first retentive through hole; juxtaposing the first electrical component on the first side of the substrate, and inserting the first retentive pin into the first retentive through hole; heating the substrate such that at least a portion of the plating material migrates from the first retentive pin into the solder paste, wherein a mixed solder composition is created which has a higher melting point than that of said first solder composition; disposing solder paste of the first solder composition into the second retentive through hole; providing a second electrical component including a second retentive pin extending therefrom, wherein the second retentive pin has a diameter smaller than that of the second retentive through hole; juxtaposing the second electrical component on the second side of the substrate, and inserting the second retentive pin into the second retentive through hole; and heating the substrate to a temperature sufficient to reflow the first solder composition and below the melting point of the mixed solder composition.

Electronic assemblies are also provided by the present invention. In accordance with a preferred embodiment of the present invention, there has now been provided an electronic assembly comprising a circuit board including a retentive through hole having a wall; an electrical component including a housing and retentive pin extending therefrom mounted on the circuit board, wherein the retentive pin is disposed within said retentive through hole and has a diameter less than that of the retentive through hole; and reflowed solder disposed in the retentive through hole and surrounding at least a portion of the retentive pin, wherein the reflowed solder includes material originally associated with at least one of the retentive pin and the retentive through hole wall, and wherein the reflowed solder has a melting point greater than a melting point of pure solder.

In accordance with another preferred embodiment of the present invention, there has now been provided an electronic assembly comprising a circuit board including a retentive through hole; an electrical component including a housing and retentive pin extending therefrom mounted on the circuit board, wherein the retentive pin is disposed within the retentive through hole and has a diameter less than that of the retentive through hole; and reflowed solder disposed in the retentive through hole and surrounding the retentive pin, wherein at least about 0.5% by weight of said reflowed solder is an additive comprising a precious metal.

In accordance with yet another preferred embodiment of the present invention, there has now been provided an electronic assembly comprising a circuit board including a retentive through hole; an electrical component including a housing and retentive pin extending therefrom mounted on the circuit board, wherein the retentive pin is disposed within the retentive through hole, has a diameter less than that of the retentive through hole, and has plating material thereon; and reflowed solder disposed in the retentive through hole and surrounding the retentive pin, wherein the reflowed solder comprises at least about 0.5% by weight of the plating material that has migrated from the retentive pin.

These and various other features of novelty, and their respective advantages, are pointed out with particularity in the claims annexed hereto and forming a part hereof. However, for a better understanding of aspects of the invention, reference should be made to the drawings which form a further part hereof, and to the accompanying descriptive matter, in which there is illustrated preferred embodiments.

DETAILED DESCRIPTION OF THE PREFERRED EMBODIMENTS

Figure 1:
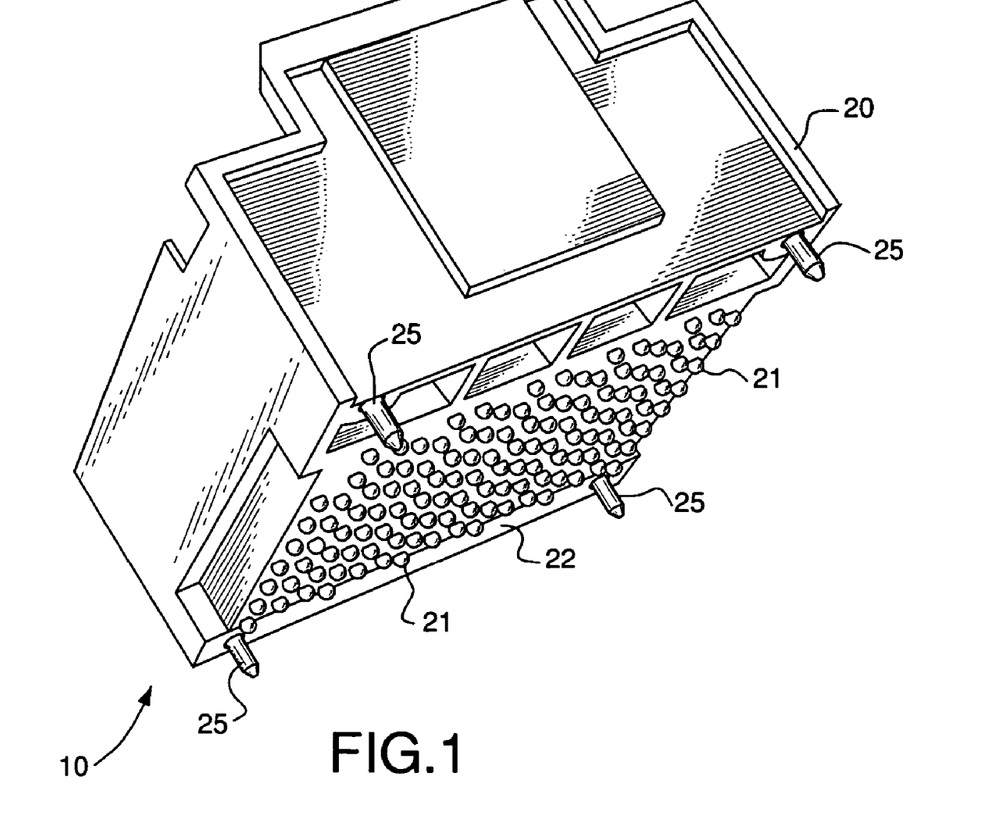
FIG. 1 is a perspective view of an electronic component designed and configured for surface mounting to a substrate.

Preferred embodiments of the present invention are directed to surface mounted electrical components having improved retentive properties and methods for making the same. Referring now to the drawings, wherein like reference numerals designate corresponding structure throughout the views, and referring in particular to FIG. 1, an electrical component 10 in the form of a connector is shown including housing 20, an array of solder balls 21 extending from a housing lower surface 22, and retentive pins 25 extending from housing lower surface 22 and spaced apart from solder balls 21. Each of solder balls 21 is coupled to an end of one of a plurality of conventional terminals (not shown) that reside within housing 20. Opposing ends of the terminals can be engaged by an electrical component, such as, for example, an integrated chip or mating electrical connector.

Figure 2:
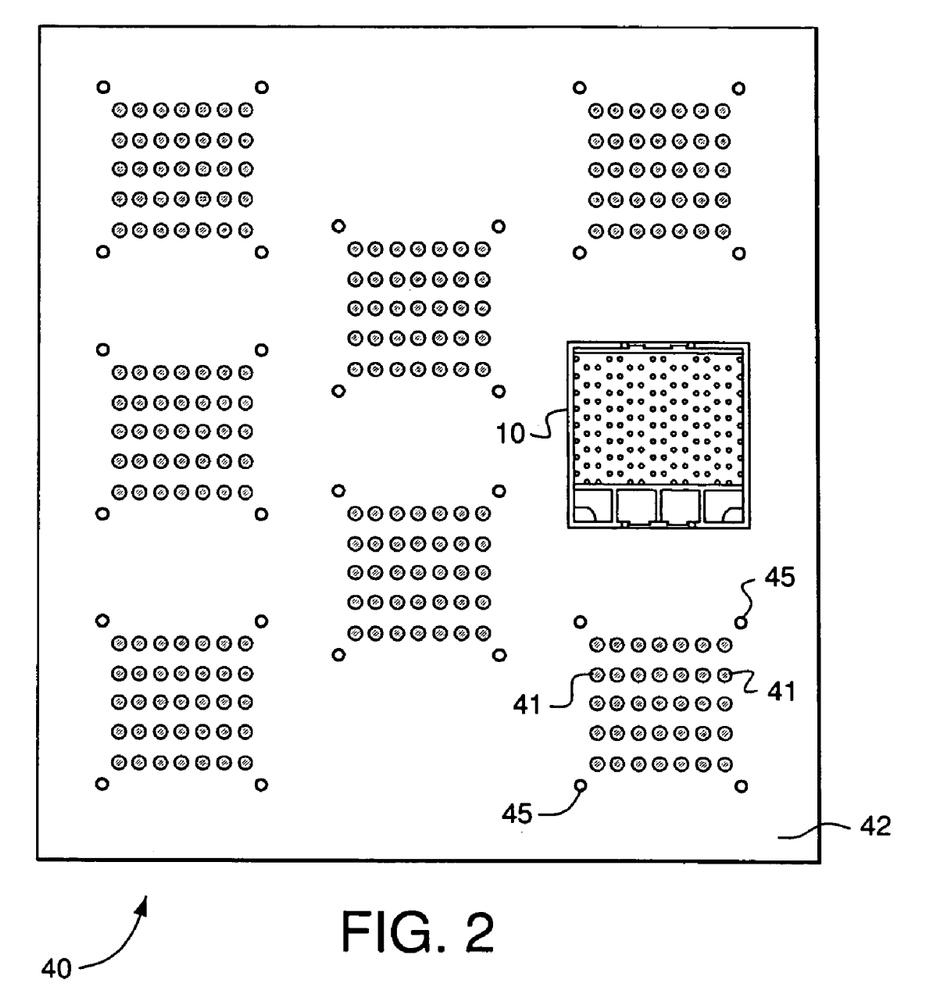
FIG. 2 is a plan view of a circuit board including surface mounting lands.

Electrical connector 10 is suitable for surface mounting to a substrate, such as the printed circuit board 40 shown in FIG. 2. Printed circuit board 40 includes a first side 42, an array of lands or pads 41 disposed on side 42 that correspond to the array of solder balls 21, and retentive through holes 45 that are designed and configured to accept retentive pins 25.

Figure 3:
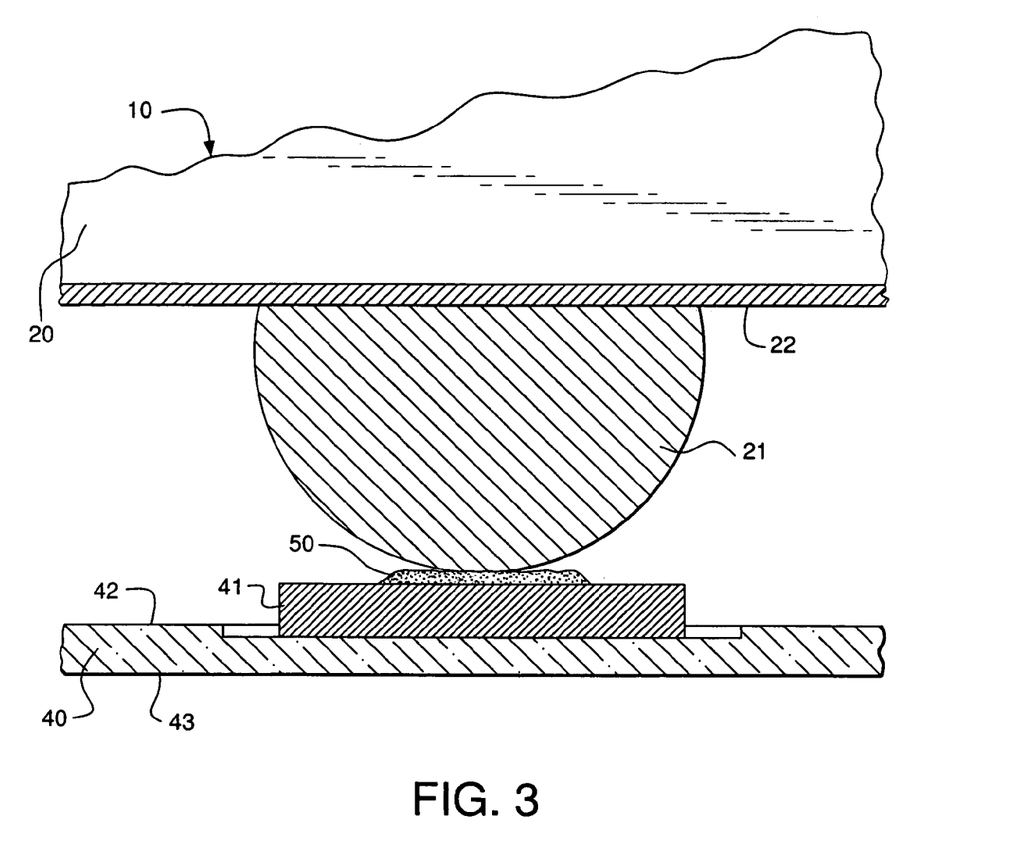
FIG. 3 is a partial side view of an electronic assembly embodiment provided by the present invention showing an electronic connector mounted to a circuit board including ball grid array interconnections
Figure 4:
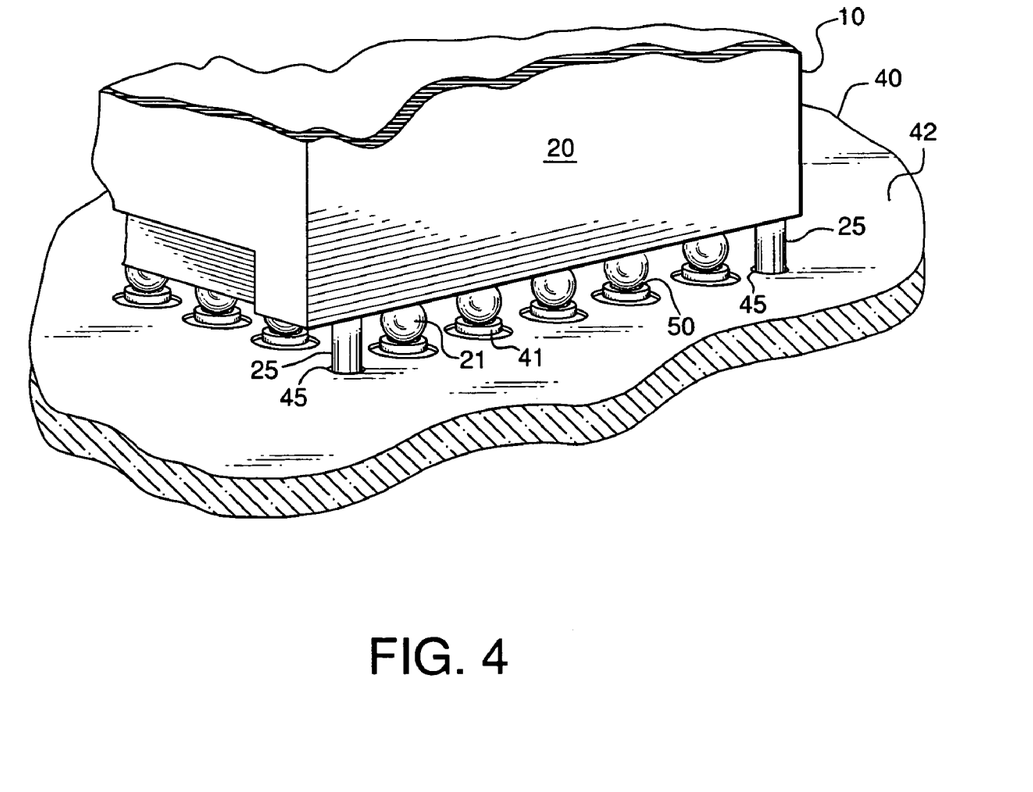
FIG. 4 is a partial perspective view of an electronic assembly embodiment provided by the present invention showing an electronic connector mounted to a circuit board including ball grid array interconnections and retentive pins disposed in solder-filled through holes.

Referring to FIGS. 3 and 4, to mount electrical connector 10 to circuit board 40, solder paste 50 is first applied to lands or pads 41, and in and/or around retentive through holes 45. Numerous techniques readily understood by one skilled in the art, such as, for example screen-printing, screening or masking, may be used to apply the solder paste. Solder paste 50 is preferably a eutectic alloy of tin and lead having a melting point of approximately 183 degrees Celsius. Electrical connector 10 is placed in juxtaposition with board 40, with individual solder balls 21 roughly aligned with corresponding individual lands or pads 41 by inserting retentive pins 25 into the solder containing retentive through holes 45. The board/component assembly is then reflowed (subjected to a thermal cycle) preferably in a stationary or belt type furnace that employs convection or radiation heat sources. The solder reflow may be performed in an environment selected from a group comprising dry nitrogen, forming gas or hydrogen. The reflow process typically includes a thermal cycle that subjects the board-component assembly to a peak temperature (or temperature at or above the melting point of the solder paste) for a time period between 15 and 150 seconds. The reflow process is conventional and well documented in the literature.

Figure 5:
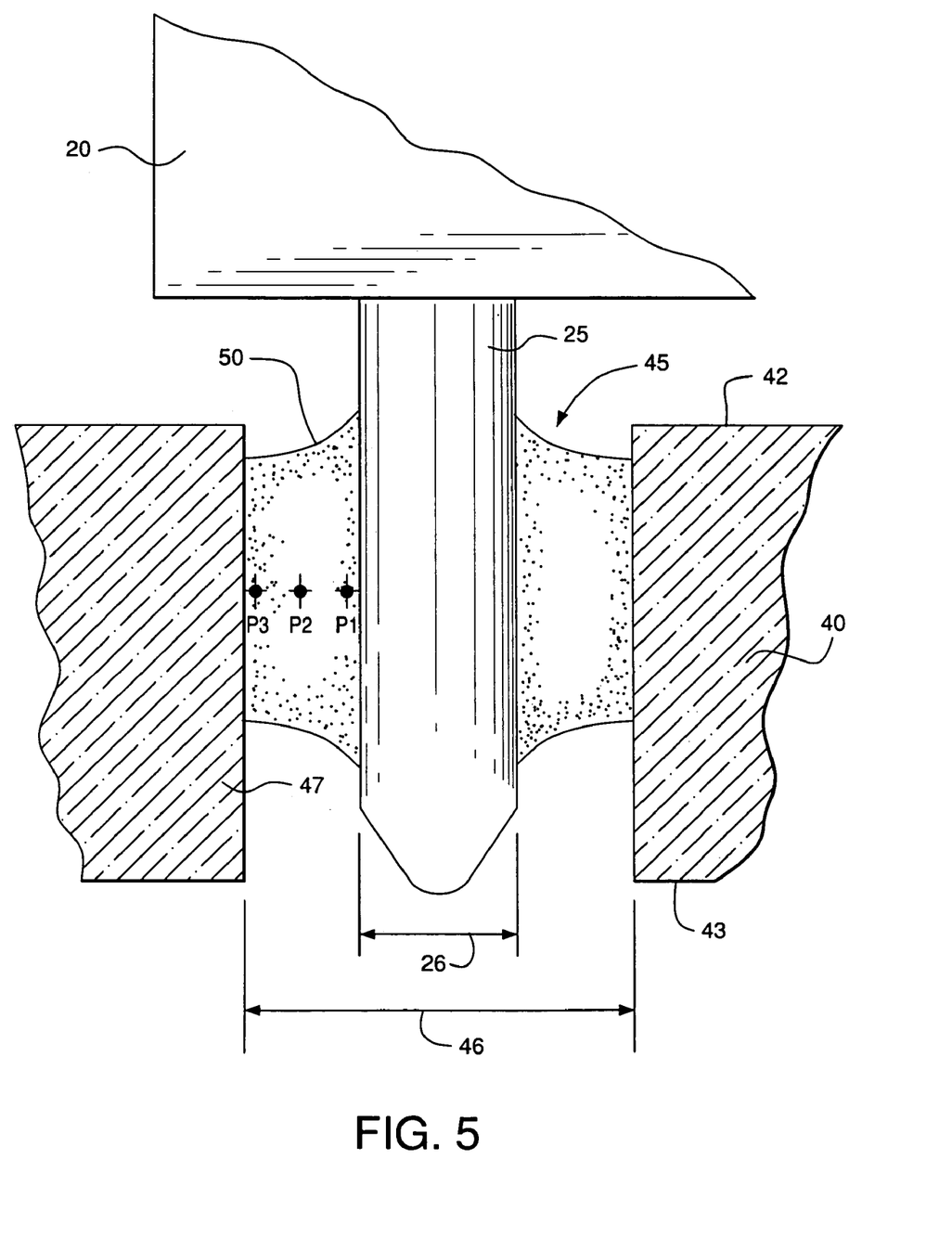
FIG. 5 is a partial cross-sectional view of an electronic component retentive pin disposed in a substrate retentive through hole with solder surrounding the retentive pin.

Referring now to FIG. 5, retentive pins 25 preferably have a diameter 26 that is smaller than the diameter 46 of the retentive through holes, such that the component being surface mounted to the board is allowed to float. For example, the pin diameters 26 may be approximately 0.9 mm and the corresponding through hole diameters 46 approximately 1.1 mm; although the specific diameters and difference between the two diameters may be greater or smaller than this. This configuration promotes self-aligning of balls 21 with lands 41, and results in a low stress solder joint.

After mounting the electrical connector 10 to board 40 (as can be seen in FIG. 2), it may be desirable to further process the board/component assembly at temperatures above the melting point of solder paste 50 without affecting solder bonds previously formed. The present invention provides method embodiments to improve the retention of mounted electrical components employing retentive pins having diameters less than the through hole diameters, by altering the solder composition within the retentive through holes 45 during or after the initial component mounting. To alter the solder composition, retentive pins 25 are plated with materials including precious metals such as gold, palladium, platinum, silver, rhodium, iridium, osmium, ruthenium, and rhenium. During the first reflow (or shortly thereafter), at least a portion of the precious plating material migrates from retentive pins 25 and into solder paste 50 residing within retentive through holes 45, thereby creating a mixed solder composition that includes an additive made up of the plating material. Due to the presence of the additive, the melting point of the mixed solder composition is higher than the melting point of the original solder composition (i.e., melting point of pure solder). The melting point of the mixed solder composition should now preferably be at least 10 degrees Celsius higher than the melting point of the original (or first) composition. Accordingly, the board assembly may be further processed to a temperature at or above the melting point of the first solder composition and below the melting point of the mixed solder composition without concern that the mounted electrical component will become separated from the board.

In alternative embodiments, a wall 47 (see FIG. 5) of retentive through holes 45 may be plated with material that will migrate into the solder paste during or after an initial reflow process. Or both the through hole walls 47 and the retentive pins 25 may be plated with similar or dissimilar materials for migration into the solder paste. The migrated material may also originate from a base composition of the retentive pins and through hole walls, rather than from plating material overlying a similar base composition. Preferably, retentive pins 25 are the sole source of the migrating material. In preferred embodiments, retentive pins 25 are made from a lead-brass alloy base material, with a first plating layer of nickel at a thickness of from about 0.00127 to about 0.00635 mm, and a second plating layer of gold or palladium at a similar thickness.

One instance where two or more reflow steps (two thermal cycles) may occur is when electrical components are mounted on both sides 42 and 43 of circuit board 40. A preferred method embodiment for mounting electrical components on opposing sides of a circuit board begins with a step of applying solder paste 50 to lands 41 and in and around retentive through holes 45 on side 42 of board 40. The solder composition at this point preferably consists essentially of tin and lead. Referring again to FIG. 4, first electrical component 10 is movably coupled to side 42 by inserting retentive pins 25 comprising a gold or palladium plating into the solder containing through holes 45. Board 40 is then subjected to a first thermal cycle including a peak temperature of about 183 degrees Celsius to reflow solder paste 50. During the first thermal cycle, at least a portion of the gold or palladium plating migrates from retentive pins 25 and into solder paste 50 residing within through holes 45. The solder composition within through holes 45 now comprises tin, lead, and gold or palladium, and has a melting point higher than 183 degrees Celsius. The amount of gold or palladium present in the reflowed solder will typically vary, with higher concentrations proximate retentive pins 25.

In preferred embodiments, the gold or palladium (or other plating material) is present in the reflowed solder in an amount of at least about 0.5% by weight.

Figure 6:
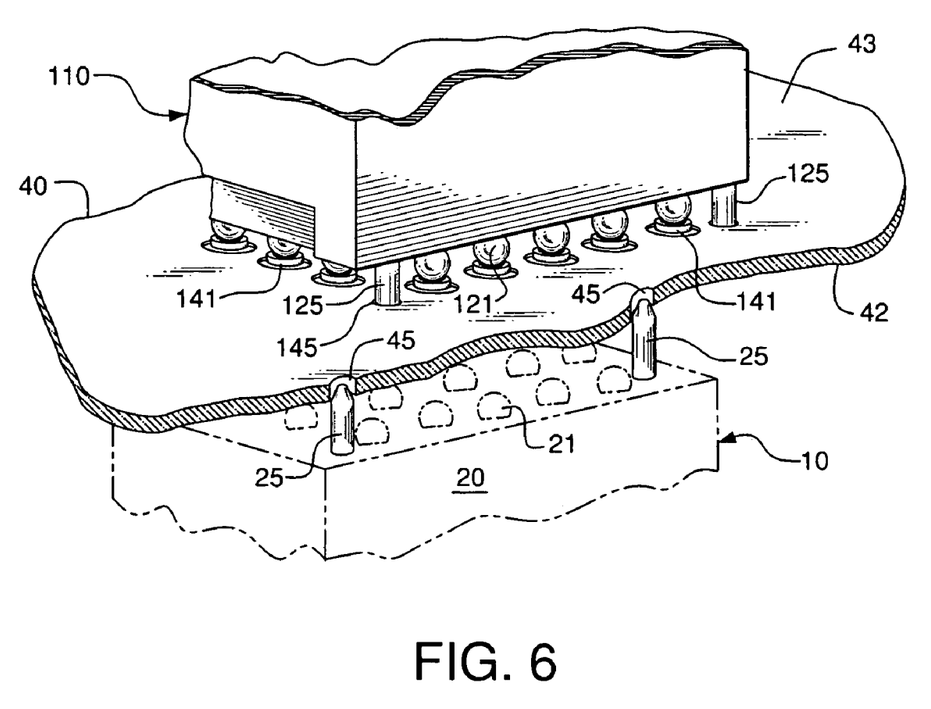
FIG. 6 is a partial perspective view of an electronic assembly embodiment provided by the present invention including electronic components surface mounted to both sides of a circuit board.

Referring now to FIG. 6, board 40 is flipped and side 43 is prepared for mounting a second electrical component thereon. The same solder paste 50 composition (consisting essential of tin and lead) used for mounting the electrical component 10 on board side 42 is now applied to lands 141 and in and around retentive holes 145 located on board side 43. A second electrical component 110 (similar or dissimilar to component 10) comprising an array of solder balls 121 and retentive pins 125 is movably coupled to board 40 in a similar fashion to that of component 10. Board 40 is subjected to a second thermal cycle including a peak temperature of about 183 degrees Celsius to reflow solder paste 50. During the second thermal cycle, reflowed solder in retentive through holes 45 does not melt, and therefore, first electrical component 10 is securely held on board 40. Retentive pins on the second electrical component 110 may or may not include materials that will migrate into the solder paste residing in retentive though holes 145. A cost savings, via materials and processing, may be realized by not including a plating material on the retentive pins (or on the walls of through holes 145) extending from electrical component 110. Obviously, if retentive pins on electrical component 110 are made with a material comprising a precious metal, then migration will likely occur during the second thermal cycle.

EXAMPLES

Example 1

Table 1 includes parameters of two preferred embodiments along with the calculated solder compositional change after a first thermal cycle.

TABLE 1

|  | Gold Plating | Palladium Plating |
| --- | --- | --- |
| Unplated pin diameter, mm | 0.90 | 0.90 |
| Plating thickness, mm | 0.0051 | 0.0051 |
| Through hole diameter, mm | 1.10 | 1.10 |
| Solder volume, mm$^3$ | 0.57 | 0.57 |
| Migration, % volume | 60 | 40 |
| Migrated material in reflowed solder, % volume | 6.10 | 4.20 |
| Original solder melting point, ° Celsius | 183 | 183 |
| Altered solder melting point, ° Celsius | 226 | 235 |

Example 2

Un-plated retentive pins having a diameter of 0.90 mm were plated with gold or palladium at a thickness of approximately 0.0051 mm. A eutectic tin-lead solder paste was applied in and around retentive holes extending through a board. The retentive through holes had a diameter of 1.10 mm. The plated retentive pins were inserted into the retentive through holes and the board subjected to a thermal cycle sufficient to reflow the solder paste. Samples of the altered solder were taken at three positions, as shown in FIG. 5: 1) proximate the retentive pin—P1; 2) proximate the wall of the retentive through hole—P3; and 3) an intermediate position—P2. The solder samples were analyzed via mass spectrometry. Table 2 shows the amount of plating material (% by weight) present in the solder after completing the thermal cycle.

TABLE 2

| Pin Plating Material | Solder Sample Position | Plating Material in Solder, % by weight |
| --- | --- | --- |
| Gold | P1 | 14.88 |
| Gold | P2 | 5.84 |
| Gold | P3 | 4.58 |
| Palladium | P1 | 19.62 |
| Palladium | P2 | 6.05 |
| Palladium | P3 | 1.78 |

As can be seen in Table 2, the plating material diffuses all the way through the solder disposed within the retentive through holes. That is, the plating material presence in the solder is not isolated to the solder region nearest to the material source (retentive pin). In addition, Table 2 illustrates that gold diffuses more effectively than palladium through the tin-lead solder once the material is leached off of the retentive pins.

It is to be understood that even though numerous characteristics and advantages of the present invention have been set forth in the foregoing description, together with details of the structure, manufacture of, and function of the invention, the disclosure is illustrative only. Accordingly, changes may be made in detail, especially in matters of shape, size and arrangement of structural features, as well as, sequences of manufacturing steps, within the principles of the invention to the full extent indicated by the broad general meaning of the terms in which the appended claims are expressed.

What is claimed is:

1. A method for mounting and retaining an electrical component on a substrate that is subjected to at least two thermal cycles, the method comprising the steps of:
   a) providing a substrate including a retentive through hole having a wall;
   b) providing an electrical component having a retentive pin extending therefrom, said retentive pin having a diameter smaller than that of said retentive through hole;
   c) disposing solder paste of a first solder composition into said retentive through hole;
   d) inserting said retentive pin into said retentive through hole;
   e) subjecting said substrate to a first thermal cycle such that material associated with at least one of said retentive through hole wall and said retentive pin migrates into said solder paste to create a mixed solder composition which has a higher melting point than that of said first solder composition; and
   f) subjecting said substrate to a second thermal cycle having a peak temperature less than the melting point of said mixed solder composition, whereby said retentive pin remains securely held in said retentive through hole.

2. The method of claim 1, wherein the migrated material was originally plating material disposed on said retentive pin.

3. The method of claim 2, wherein the plating material comprises palladium.

4. The method of claim 2, wherein the plating material comprises gold.

5. The method of claim 1, wherein the migrated material was originally plating material disposed on said retentive through hole wall.

6. The method of claim 1, wherein the migrated material includes plating material originally disposed on both of said retentive through hole wall and said retentive pin.

7. The method of claim 1, wherein the migrated material is present in an amount of at least about 0.5% by weight at a solder location proximate said retentive through hole wall.

* * * * *